(12) United States Patent
Lee et al.

(10) Patent No.: US 7,910,155 B2
(45) Date of Patent: Mar. 22, 2011

(54) METHOD FOR MANUFACTURING HIGH TEMPERATURE SUPERCONDUCTING CONDUCTOR

(75) Inventors: Hee-Gyoun Lee, Ansan (KR); Venkat Selvamanickam, Wynantskill, NY (US)

(73) Assignee: Superpower, Inc., Schenectady, NY (US)

( * ) Notice: Subject to any disclaimer, the term of this patent is extended or adjusted under 35 U.S.C. 154(b) by 642 days.

(21) Appl. No.: 11/326,895

(22) Filed: Jan. 6, 2006

(65) Prior Publication Data

US 2010/0009064 A1    Jan. 14, 2010

Related U.S. Application Data

(62) Division of application No. 10/821,207, filed on Apr. 8, 2004, now abandoned.

(51) Int. Cl.
*B05D 5/12* (2006.01)
*H01L 39/24* (2006.01)
*C23C 14/00* (2006.01)

(52) U.S. Cl. ....... 427/62; 29/599; 204/192.24; 505/310; 505/434; 505/447; 505/473; 505/726

(58) Field of Classification Search ............... 427/62; 29/599; 204/192.24; 505/310, 434, 447, 505/473, 726
See application file for complete search history.

(56) References Cited

U.S. PATENT DOCUMENTS

| | | | |
|---|---|---|---|
| 3,400,415 A * | 9/1968 | Scheurer | 441/112 |
| 3,549,416 A * | 12/1970 | Rump et al. | 427/566 |
| 3,933,028 A | 1/1976 | Laud et al. | |
| 4,001,758 A | 1/1977 | Esper et al. | |
| 4,004,452 A | 1/1977 | Logothetis et al. | |
| 4,344,127 A | 8/1982 | McDaniel et al. | |
| 4,396,976 A | 8/1983 | Hyatt | |
| 4,413,502 A | 11/1983 | Ohta et al. | |
| 4,443,781 A | 4/1984 | Ohta et al. | |
| 4,450,428 A | 5/1984 | Ohta et al. | |
| 4,453,397 A | 6/1984 | Ohta et al. | |
| 4,646,223 A | 2/1987 | Sekiguchi | |
| 4,777,022 A | 10/1988 | Boldish et al. | |
| 4,803,947 A | 2/1989 | Ueki et al. | |
| 4,854,263 A | 8/1989 | Chang et al. | |
| 4,916,600 A | 4/1990 | Ropelato | |
| 4,924,800 A | 5/1990 | Tanaka | |

(Continued)

FOREIGN PATENT DOCUMENTS

WO      WO 95/31582 A      11/1995

(Continued)

OTHER PUBLICATIONS

McIntyre, P.C. et al., "Epitaxial Nucleation and Growth of Chemical Derived Ba2YCu3O7-x Thin Films on (001) SrTiO3", Journal of Applied Physics, vol. 77, No. 10, May 1995, pp. 5263-5272.

(Continued)

*Primary Examiner* — Brian K Talbot
(74) *Attorney, Agent, or Firm* — Larson Newman & Abel, LLP

(57) ABSTRACT

A method for manufacturing a high-temperature superconducting conductor includes translating an elongated substrate through a reactor. Further, a high temperature superconducting layer is formed on the substrate translating through the reactor by deposition of a reaction product of metalorganic precursor materials onto the substrate. Further, partial pressure of oxygen is monitored to indirectly monitor supply of metalorganic precursors into the reactor.

11 Claims, 7 Drawing Sheets

U.S. PATENT DOCUMENTS

| | | | |
|---|---|---|---|
| 4,949,669 | A | 8/1990 | Ishii et al. |
| 5,059,770 | A | 10/1991 | Mahawili |
| 5,156,376 | A | 10/1992 | Spicer |
| 5,204,314 | A | 4/1993 | Kirlin et al. |
| 5,304,398 | A | 4/1994 | Krusell et al. |
| 5,324,361 | A | 6/1994 | Etzkorn et al. |
| 5,329,097 | A | 7/1994 | Jones et al. |
| 5,351,200 | A | 9/1994 | Impink, Jr. |
| 5,441,703 | A | 8/1995 | Jurgensen |
| 5,458,086 | A * | 10/1995 | Smith et al. .................. 117/200 |
| 5,536,323 | A | 7/1996 | Kirlin et al. |
| 5,554,224 | A | 9/1996 | Foltyn |
| 5,579,218 | A | 11/1996 | Ehlig et al. |
| 5,595,606 | A | 1/1997 | Fujikawa et al. |
| 5,622,606 | A | 4/1997 | Kugler et al. |
| 5,624,498 | A | 4/1997 | Lee et al. |
| 5,648,006 | A | 7/1997 | Min et al. |
| 5,653,806 | A | 8/1997 | Van Buskirk |
| 5,689,415 | A | 11/1997 | Calotychos et al. |
| 5,707,500 | A | 1/1998 | Shimamura et al. |
| 5,711,816 | A | 1/1998 | Kirlin et al. |
| 5,726,912 | A | 3/1998 | Krall, Jr. et al. |
| 5,739,086 | A | 4/1998 | Goyal et al. |
| 5,741,377 | A | 4/1998 | Goyal et al. |
| 5,766,363 | A | 6/1998 | Mizuno et al. |
| 5,776,254 | A | 7/1998 | Yuuki et al. |
| 5,783,153 | A | 7/1998 | Logothetis et al. |
| 5,820,678 | A | 10/1998 | Hubert et al. |
| 5,869,744 | A | 2/1999 | Suzuki et al. |
| 5,872,080 | A | 2/1999 | Arendt et al. |
| 5,876,673 | A | 3/1999 | Logothetis et al. |
| 5,898,020 | A | 4/1999 | Goyal et al. |
| 5,919,310 | A | 7/1999 | Fujioka et al. |
| 5,942,674 | A | 8/1999 | Logothetis et al. |
| 5,958,599 | A | 9/1999 | Goyal et al. |
| 5,964,966 | A | 10/1999 | Goyal et al. |
| 5,980,078 | A | 11/1999 | Krivoshein et al. |
| 6,010,748 | A | 1/2000 | Van Buskirk et al. |
| 6,022,832 | A | 2/2000 | Fritzemeier et al. |
| 6,027,564 | A | 2/2000 | Fritzemeier et al. |
| 6,066,836 | A | 5/2000 | Chen et al. |
| 6,106,615 | A | 8/2000 | Goyal et al. |
| 6,156,376 | A | 12/2000 | Paranthanman et al. |
| 6,196,251 | B1 | 3/2001 | Roehle |
| 6,206,972 | B1 | 3/2001 | Dunham |
| 6,232,580 | B1 | 5/2001 | Sandhu |
| 6,245,192 | B1 | 6/2001 | Dhindsa et al. |
| 6,294,026 | B1 | 9/2001 | Roithner et al. |
| 6,331,199 | B1 | 12/2001 | Goyal et al. |
| 6,341,519 | B1 | 1/2002 | Khesin et al. |
| 6,383,989 | B2 | 5/2002 | Jia et al. |
| 6,426,320 | B1 | 7/2002 | Fritzemeier et al. |
| 6,447,714 | B1 | 9/2002 | Goyal et al. |
| 6,451,450 | B1 | 9/2002 | Goyal et al. |
| 6,458,223 | B1 | 10/2002 | Hans Thieme et al. |
| 6,475,311 | B1 | 11/2002 | Fritzemeier et al. |
| 6,477,980 | B1 | 11/2002 | White et al. |
| 6,537,419 | B1 | 3/2003 | Kinnard |
| 6,541,121 | B2 | 4/2003 | Usoskin et al. |
| 6,541,136 | B1 | 4/2003 | Kwon et al. |
| 6,553,932 | B2 | 4/2003 | Liu et al. |
| 6,562,761 | B1 | 5/2003 | Fritzemeier et al. |
| 6,599,346 | B2 | 7/2003 | Goyal et al. |
| 6,602,313 | B2 | 8/2003 | Goyal et al. |
| 6,607,838 | B2 | 8/2003 | Goyal et al. |
| 6,607,839 | B2 | 8/2003 | Goyal et al. |
| 6,610,413 | B2 | 8/2003 | Goyal et al. |
| 6,610,414 | B2 | 8/2003 | Goyal et al. |
| 6,610,632 | B2 | 8/2003 | Honjo et al. |
| 6,632,776 | B2 * | 10/2003 | Kobayashi et al. ........... 505/470 |
| 6,797,313 | B2 * | 9/2004 | Fritzemeier et al. ........... 427/62 |
| 2001/0056041 | A1 | 12/2001 | Jia et al. |
| 2002/0011212 | A1 | 1/2002 | Ogawa et al. |
| 2002/0192377 | A1 | 12/2002 | Bartholomew et al. |
| 2003/0036483 | A1 | 2/2003 | Arendt et al. |
| 2003/0172873 | A1 | 9/2003 | Fischer et al. |
| 2004/0016401 | A1 * | 1/2004 | Ignatiev et al. ............... 118/718 |
| 2004/0060514 | A1 | 4/2004 | Janakiraman et al. |
| 2005/0256011 | A1 * | 11/2005 | Ignatiev et al. ............... 505/473 |

FOREIGN PATENT DOCUMENTS

| | | |
|---|---|---|
| WO | WO 2005/062762 A | 7/2005 |

OTHER PUBLICATIONS

Rupich, M.W., et al., "YBCO Coated Conductors by an MOD/RABiTS(TM) Process", IEEE Transactions on Applied Superconductivity, vol. 13, No. 2, Jun. 2003, pp. 2458-2461.

* cited by examiner

Cross sectional view

Top view of middle plate

Bottom view

Cross sectional view

Top view of middle plate

Side view

METHOD FOR MANUFACTURING HIGH TEMPERATURE SUPERCONDUCTING CONDUCTOR

CROSS-REFERENCE TO RELATED APPLICATION(S)

The present application is a divisional application of U.S. application Ser. No. 10/821,207, filed Apr. 8, 2004, now abandoned, which is incorporated herein by reference in its entirety.

The following related application filed on same day herewith is hereby incorporated by reference in its entirety for all purposes: U.S. patent application Ser. No. 10/820,634; inventors Venkat Selvamanickam and Hee-Gyoun Lee; and entitled "A CHEMICAL VAPOR DEPOSITION (CVD) APPARATUS USABLE IN THE MANUFACTURE OF SUPERCONDUCTING CONDUCTORS."

The present invention relates generally to a chemical vapor deposition (CVD) apparatus and, more particularly, to a CVD apparatus capable of continuously forming a superconducting material on the surface of an elongate substrate to manufacture superconducting conductors. The CVD apparatus is capable of continuously forming a non-superconducting oxide material on the surface of an elongate substrate that also may be used to manufacture superconducting conductors.

BACKGROUND

In the past three decades, electricity has risen from 25% to 40% of end-use energy consumption in the United States. With this rising demand for power comes an increasingly critical requirement for highly reliable, high quality power. As power demands continue to grow, older urban electric power systems in particular are being pushed to the limit of performance, requiring new solutions.

Metal conductors, such as copper and aluminum, form a foundation of the world's electric power system, including generators, transmission and distribution systems, transformers, and motors. The discovery of high-temperature superconducting (HTS) compounds in 1986 has led to an effort to develop conductors incorporating HTS compounds for the power industry to replace metal conductors. HTS conductors are one of the most fundamental advances in electric power system technology in more than a century.

HTS conductors can carry over one hundred times more current than conventional metal conductors of the same physical dimension. The superior power density of HTS conductors will enable the development of a new generation of power industry technologies. HTS conductors offer major size, weight, efficiency, and environmental benefits. HTS technologies will drive down costs and increase the capacity and reliability of electric power systems in a variety of ways. For example, an HTS conductor is capable of transmitting two to five times more power through existing rights-of-way, thus improving the performance of power grids while reducing their environmental footprint.

However, to date, only short samples of the HTS conductors have been fabricated at high performance levels. For HTS technology to become commercially viable for use in the power generation and distribution industry, it will be necessary to develop equipment for continuous, high-throughput production of HTS conductors.

One way to characterize HTS conductors is by their cost per meter. An alternative way to characterize HTS conductors is by cost per kiloamp-meter. That is, by increasing the current-carrying capacity for a given cost per meter of an HTS conductor, the cost per kiloamp-meter is reduced. This is demonstrated in the critical current density (Jc) of the deposited HTS material multiplied by the cross-sectional area of the material.

For a given critical current and width of HTS material, one way to increase the cross-sectional area is to increase the HTS material thickness. However, under conventional process parameters, it has been demonstrated that with critical current density as a function of thickness, the critical current density drops off as the thickness of a single layer of HTS material increases beyond approximately 1.5 microns and may reach saturation. This is because beyond a film thickness of approximately 1.5 microns, the HTS material becomes very porous, develops voids, and develops increased surface roughness, all of which contribute to inhibiting the flow of current. This results in limiting the critical current in coated conductors to typically 100 A/cm width.

Chemical vapor deposition (CVD) is a process that shows promise for the high throughput necessary to cost-effectively produce HTS conductors. During CVD, HTS material, such as yttrium-barium-copper-oxide ($YBa_2Cu_3O_7$ or "YBCO"), may be deposited by vapor-phase precursors onto a heated substrate via chemical reactions that occur at the surface of the substrate. Also, CVD and, particularly, metalorganic chemical vapor deposition (MOCVD), is an attractive process for fabrication of HTS-coated conductors at a high throughput. High throughput is partly enabled by large deposition areas that are possible with MOCVD.

However, there are several issues that need to be resolved for the uniform deposition of HTS materials over large areas on continuously moving substrates including precursor uniformity, precursor waste, and substrate temperature uniformity. Injecting a precursor uniformly for an extended time over a large deposition area of a heated substrate, in particular a moving substrate, can be especially difficult. Further, obtaining sufficiently high conversion of precursor to HTS material formed on is a challenge in particular so as to avoid waste of expensive precursors and increase deposition rate. Also, depositing HTS material on a moving substrate within the preferred temperature window is challenging.

Thus, there remains a need for a new and improved CVD apparatus that is capable of continuously and uniformly forming a superconducting material and non-superconducting material on the surface of an elongate substrate, especially on continuously moving substrate, to manufacture superconducting conductors.

SUMMARY

The present invention is directed to a chemical vapor deposition (CVD) apparatus usable in the manufacture of superconducting conductors on an elongate substrate. The CVD apparatus includes a reactor, at least one substrate heater, at least one precursor supply system, at least one precursor injector, and at least one precursor composition monitor. The precursor supply system includes at least one precursor source, at least one delivery mechanism including at least one assist vehicle, at least one vaporizer for vaporizing a precursor provided by at least the at least one precursor source, and at least one vehicle for transporting at least the vaporized precursor from the precursor supply to the precursor injector of the CVD apparatus.

The at least one precursor composition monitor comprises a precursor content monitor, such as an oxygen content monitor. An example of a suitable oxygen content monitor is a solid-state electrode that may include material such as yttria-stabilized-zirconia (YSZ).

The substrate heater includes at least one heat source. For example, the heat source heats the elongate substrate, directly, indirectly, or directly and indirectly. The heat source may be any of one of the many that are commercially available. Applicants have found, for example, that a plurality of lamps and a resistance-heating element work adequately as the heat source of the substrate heater.

When at least one susceptor is included as part of the substrate heater, the heat source heats the susceptor. In turn, the susceptor heats the elongate substrate. One advantage of using at least one susceptor is that the susceptor may be configured to have a sufficient thermal inertia so as to maintain the elongate substrate at a temperature that permits the deposition surface of the substrate at the deposition temperature. Having a sufficient thermal inertia may be particularly advantageous for a substrate that is constantly being moved beyond the substrate heater. Applicants have found that including a radius of curvature in the design of the susceptor is particularly advantageous. Such a radius of curvature may accommodate the elongate substrate and, in particular, the contacting communication of the translating elongate substrate and the susceptor.

The substrate heater may be any one of a single-zone heater, a multiple-zone heater, and combinations thereof. Further, a surface heater may be included. Whether the substrate heater is a single-zone heater, a multiple-zone heater, or combinations thereof, the surface heater is positioned so as to maintain a temperature at the growth surface on the substrate at a deposition temperature. Applicants have found that lamp-type heaters, such as for example, quartz lamps, work satisfactorily as a surface heater.

Applicants have found that it may be advantageous to include one or more shields to protect a low-temperature region of the substrate. When used, the substrate shield is positioned so that the surface temperature of the deposition coating does not exceed the deposition temperature.

The CVD apparatus may further include at least one precursor supply system. The precursor supply system includes at least one precursor source, at least one delivery mechanism including at least one assist vehicle, at least one vaporizer for vaporizing a precursor provided by at least the at least one precursor source, and, at least one vehicle for transporting at least the vaporized precursor from the precursor supply to the precursor injector of the CVD apparatus. The at least one assist vehicle may be an assist fluid, such as an inert gas, for example, argon.

The precursor source may any of the type known in the art such as for example, a solid, liquid, and combinations thereof. A solid precursor source may be provided as mass, a powder, and a mass that is subsequently powdered. A liquid precursor source may be provided in a solvent based manner, a solventless based manner, and combinations thereof.

Examples of categories of metalorganic compounds usable as precursors include: metal β-diketonates, such as M(thd)y (where thd may be a tetramethylheptanedione such as 2,2,6,6-tetramethyl-3,5-heptanedionate), M(thd)y(OR)z (where thd may be a tetramethylheptanedione such as 2,2,6,6-tetramethyl-3,5-heptanedionate and R may be an alkyl group), and M(acac)y (where acac may be an acetylacetonate such as 2,4-pentanedionate); alkoxides, such as ethoxide (OEth), iso-propoxide (i-OPr), and butoxide (n-OBut); alkylmetal; and carboxylates, such as benzoate and ethylhexanoate (eha). M may be any one of RE, Ba, and Cu. RE is a first rare earth element of any one of Y, La, Nd, Sm, Eu, Gd, Dy, Ho, Er, Tm, Yb, Lu, and combinations thereof. When a solution is used, any appropriate solvent that is compatible with the metalorganic compounds may be used. For example, any one of tetrahydrofuran (THF), isopropanol, and combinations thereof may be used with M(thd)y.

The delivery mechanism provides the precursors to the vaporizer in a predetermined amount. When the precursor source comprises a liquid, the delivery mechanism may be a pump. When the precursor source comprises a solid, the delivery mechanism may be one of a mill, a conveyor, and combinations thereof. Further, a liquid solution may be provided and any solvent evaporated therefrom. Then, the resultant solid may be provided by, for example, a conveyor.

Further, the CVD apparatus may include an exhaust system. The exhaust system is for removing reaction products from the elongate substrate surface. In this manner, the precursor provided by the injector may more effectively reach the surface of the elongate substrate to facilitate the growth of the coating. The exhaust system may include a vacuum system in communication with the reactor.

The CVD apparatus may further include a gas supply that in turn may include a mass flow control mechanism. The at least one vehicle may be a carrier fluid. The gas supply may provide the carrier fluid to the precursor supply system. The carrier fluid may include an inert gas, such as argon, a reactive gas, such as one of oxygen and nitrogen oxide, and combinations of inert gases and reactive gases.

As applicants contemplate that the CVD apparatus is usable in the manufacture of superconducting conductors, the CVD apparatus may further include a tape handler such as a tape translation mechanism. Examples of usable tape translation mechanisms include at least one of a conveyor, reel-to-reel unit, robotic translator, and combinations thereof.

At least one controller may be part of the CVD apparatus, for example, to coordinate the operation of its various parts, components, and peripherals. For example, the controller may be in communication with the at least the substrate heater. Further, to facilitate the operation of the CVD apparatus, its various parts, components, and peripherals, at least one sensor is in communication with the at least one controller. Examples of the at least one sensor include any one of a flow meter, a species monitor, a filament state monitor, a deposition sensor, a temperature sensor, a pressure sensor, a vacuum sensor, a speed monitor, and combinations thereof.

Some specific examples of use of the at least one controller include regulating: the at least one precursor injector; at least one precursor supply system; a translational speed of the elongate substrate, and combinations thereof.

Turning now to the precursor injector and its parts and peripherals. For example, the longitudinal flow distributor may include an entrance, a receiver volume, a distributor, a distribution volume, and a plurality of exits. The entrance may be a tube. The distributor may be a perforated member having, for example, a density of about 1 to about 10 holes per inch.

Applicants have found that the precursor injector provides that precursor in a more desirable manner when the distribution volume is less than the receiver volume. Also, Applicants have found that making the receiver volume greater than a total volume of perforations in the perforated member is beneficial. Further, Applicants have found that a total volume of the perforations greater than the distribution volume provides an advantage. A vapor delivery communicates with the precursor injector. Applicants have found that it is beneficial for a volume of the vapor delivery to be greater than the receiver volume.

Concerning other aspects of the precursor injector, when the entrance, such as a tubular passage, is substantially in the center of the injector, Applicants have found that an equal volume of perforations on both sides of the entrance is beneficial. Further, Applicants have found that it may be desirable for the volume of perforations to increase in an increasing direction from the entrance. For example, the volume of perforations may be increased by increasing the diameter of the perforations in an increasing direction from the entrance. Alternatively, the volume of perforations may be increased by increasing the thickness of the perforated member in an increasing direction from the entrance.

Also, it may be advantageous for the precursor injector accordingly to include a temperature regulation system. At least one and, optionally, a plurality of temperature sensors may communicate with the precursor injector as part of the regulation system. The temperature regulation system for the injector may further include one of a heat source, a cooler, and combinations thereof.

With respect to the lateral flow restrictor of the precursor injector, it may be a physical extension of the precursor injector. Alternatively, the lateral flow restrictor may be a gas curtain emanating from the precursor injector. In either case, the lateral flow restrictor is spaced relative to the substrate heater in a manner so as to permit the exhausting of reaction products from the surface of the elongate substrate.

Accordingly, one aspect of the present invention is to provide a chemical vapor deposition (CVD) apparatus usable in the manufacture of superconducting conductors on an elongate substrate. The CVD apparatus includes a reactor, at least one substrate heater, at least one precursor supply system, at least one precursor injector, and at least one precursor composition monitor.

Another aspect of the present invention is to provide a precursor supply system usable with a reactor of a chemical vapor deposition (CVD) apparatus in combination with a substrate heater, precursor injector and usable in the manufacture of superconducting conductor on an elongate substrate. The precursor supply system includes at least one precursor source, at least one a delivery mechanism including at least one assist vehicle, at least one vaporizer for vaporizing a precursor provided by at least the at least one precursor source, and at least one vehicle for transporting at least the vaporized precursor from the precursor supply to the precursor injector of the CVD apparatus.

Still another aspect of the present invention is to provide a chemical vapor deposition (CVD) apparatus usable in the manufacture of superconducting conductors on an elongate substrate. The CVD apparatus includes a reactor, at least one substrate heater, at least one precursor supply system, at least one precursor injector, and at least one precursor composition monitor. The precursor supply system includes at least one precursor source, at least one delivery mechanism including at least one assist vehicle, at least one vaporizer for vaporizing a precursor provided by at least the at least one precursor source, and at least one vehicle for transporting at least the vaporized precursor from the precursor supply to the precursor injector of the CVD apparatus.

These and other aspects of the present invention will become apparent to those skilled in the art after a reading of the following description of the preferred embodiment when considered with the drawings.

DETAILED DESCRIPTION

Figure 1:
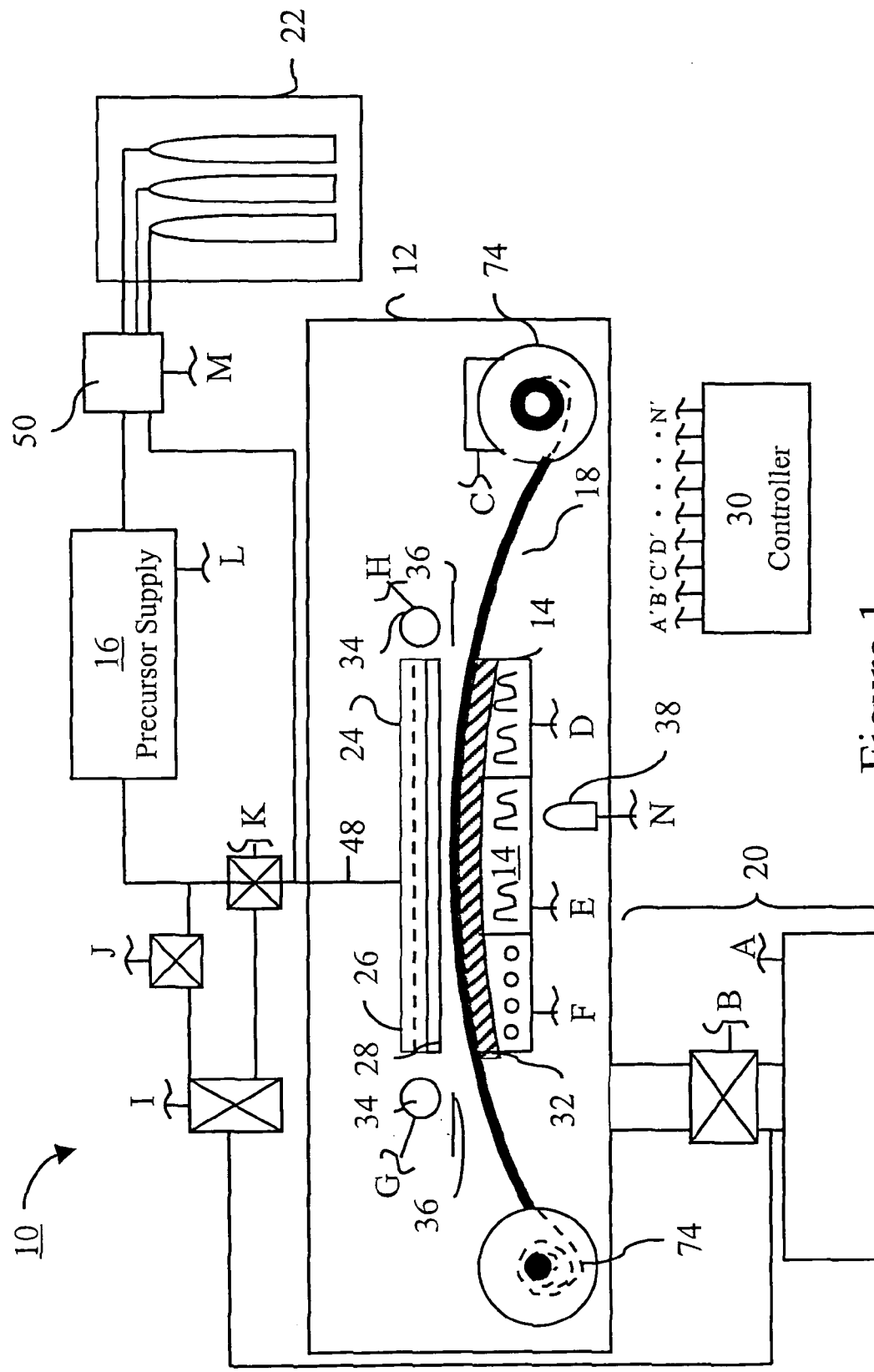
FIG. 1 is a schematic illustrating a CVD apparatus constructed according to the present invention.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto. FIG. 1 shows a chemical vapor deposition (CVD) apparatus 10 according to the present invention. The CVD apparatus 10 includes a reactor 12, at least one substrate heater 14, at least one precursor supply system 16 and at least one precursor injector 24, and at least one gas composition monitor 38.

As shown in FIG. 1, the at least one precursor injector 24 may have a longitudinal flow distributor 26, a transverse lateral flow restrictors 28, and associated shields 36 for protecting a low-temperature region of a substrate 18 being coated. The CVD apparatus 10 as depicted in FIG. 1 also includes an exhaust system 20, a gas supply 22, a controller 30, surface heaters 34, a mass flow regulator 50, and a substrate translation mechanism 74.

The at least one gas composition monitor 38 may be a precursor content monitor. As the composition of the precursor may be complex, the precursor content monitor may monitor one aspect of the precursor. As an example, a generalized form of a chemical reaction for the formation of a rare earth superconducting oxide ($REBa_2CU_3O_7$) is presented:

$RE(C_{17}H_{19}O_2)3 + 2Ba(C_{17}H_{19}O_2)2(C_{12}H_8N_2)2 + 3Cu(C_{17}H_{19}O_2)2 + 333O_2 \Longleftrightarrow REBa_2Cu_3O_7 + 269CO_2 + 139H_2O + 8NO_2,$ where Re is a first rare earth element of any one of Y, La, Nd, Sm, Eu, Gd, Dy, Ho, Er, Tm, Yb, Lu, and combinations thereof. In this generalized reaction, knowing the oxygen partial pressure may be an indication of the quality of the rare earth superconducting oxide. To that end, the precursor content monitor may be an oxygen content monitor. One example of an oxygen content monitor is a solid-state electrode, such as a material like YSZ. Systems using such electrodes are commercially available and are disclosed, for example, in U.S. Pat. Nos. 5,942,674; 5,876,673; 5,869,744; 5,783,153; 4,453,397; 4,453,397 4,450,428; 4,443,781; 4,413,502; 4,004,452; 4,001,758; and 3,933,028 (the disclosure of each being hereby incorporated by reference in their entirety).

Applicants have used a gas composition monitor 38 to record the variation of oxygen content in reactor 12 during HTS film deposition by Metalorganic Epitaxial Chemical Vapor Deposition (MOCVD). The oxygen content was steady during HTS film deposition over about 20 hours by MOCVD method using a single source liquid precursor. As the oxygen content in reactor 12 appears to be directly related to the amount of liquid precursor fed into evaporator, it may be concluded that the liquid precursor was fed constantly for about 20 hours HTS film deposition.

Applicants therefore submit that an on-line monitoring of oxygen content may be used to not only evaluate, but to control that stability in precursor supply. Such control may be achieved by, for example, having the at least one precursor supply system 16 and at least one gas composition monitor 38 communicate during deposition.

Other examples of a gas composition monitor 38 may include a residual gas analyzer (RGA). Such technology may look at any one of specific species, fragments of species, ratios of species, and combinations thereof.

Figure 2:
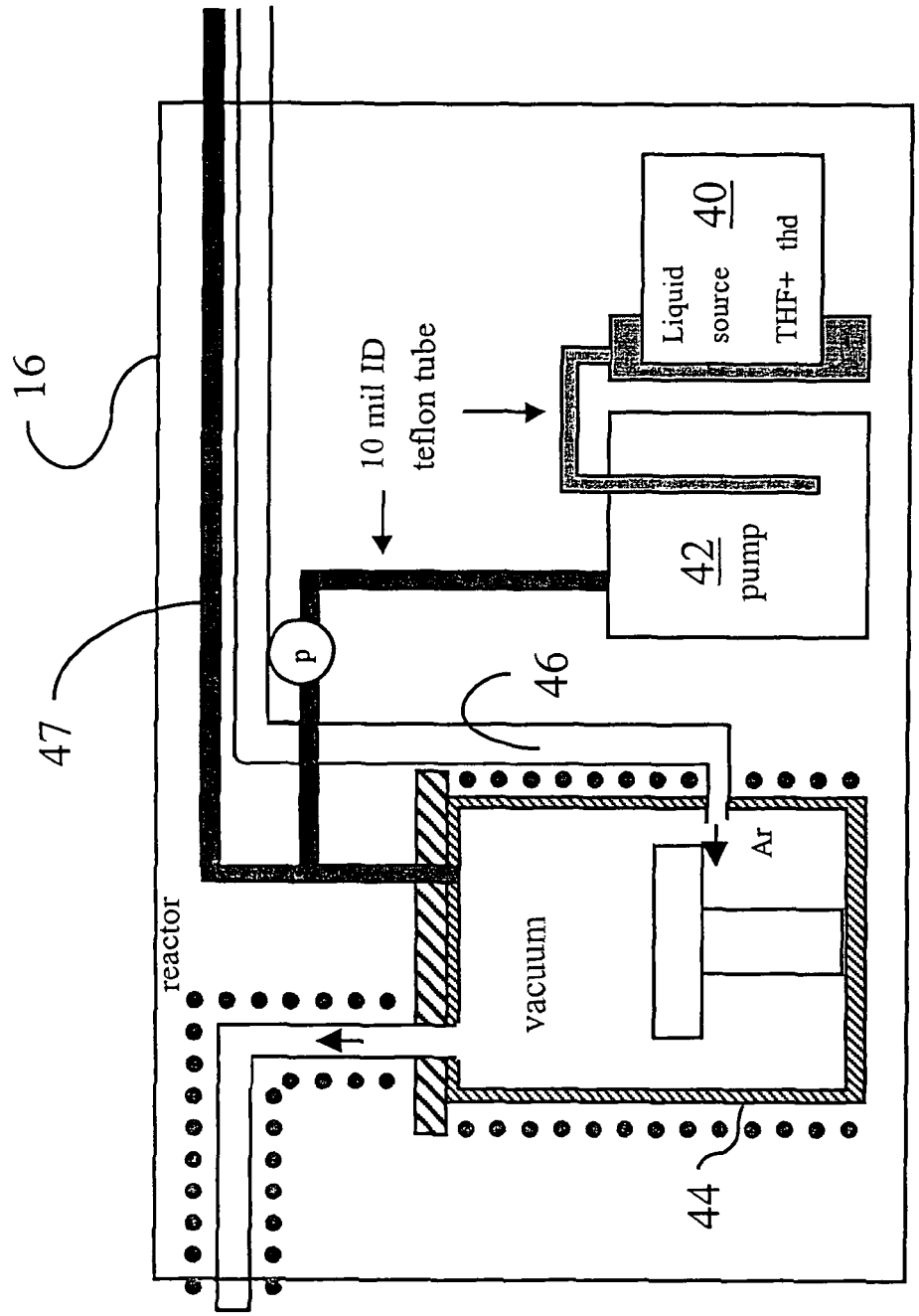
FIG. 2 is a schematic illustrating a precursor supply system usable in the CVD apparatus of FIG. 1.

Turning now to FIG. 2 and the precursor supply system 16 that includes at least one precursor source 40, at least one delivery mechanism 42 including at least one assist vehicle 47, at least one vaporizer 44 for vaporizing a precursor provided by at least the at least one precursor source 40, and, at least one vehicle 46 for transporting at least the vaporized precursor from the precursor supply to the precursor injector of the CVD apparatus. The at least one assist vehicle 47 may be an assist fluid, such as an inert gas, for example, argon.

The precursor source 40 may be any of the type known in the art such as for example, a solid, liquid, and combinations thereof. A solid precursor source may be provided as mass, a powder, and a mass that is subsequently powdered. A liquid precursor source may be provided in a solvent based manner, a solventless based manner, and combinations thereof.

Examples of categories of metalorganic compounds usable as precursors include: metal β-diketonates, such as M(thd)y (where thd may be a tetramethylheptanedione such as 2,2,6,6-tetramethyl-3,5-heptanedionate), M(thd)y(OR)z (where thd may be a tetramethyleptanedione such as 2,2,6,6-tetramethyl-3,5-heptanedionate and R may be an alkyl group), and M(acac)y (where acac may be an acetylacetonate such as 2,4-pentanedionate); alkoxides, such as ethoxide (OEth), isopropoxide (i-OPr), and butoxide (n-OBut); alkylmetal; and carboxylates, such as benzoate and ethylhexanoate (eha). M may be any one of RE, Ba, and Cu. RE is a first rare earth element of any one of Y, La, Nd, Sm, Eu, Gd, Dy, Ho, Er, Tm, Yb, Lu, and combinations thereof. When a solution is used, any appropriate solvent that is compatible with the metalorganic compounds may be used. For example, any one of tetrahydrofuran (THF), isopropanol, and combinations thereof may be used with M(thd)y.

The delivery mechanism 42 provides the precursors to the vaporizer 44 in a predetermined amount. When the precursor source comprises a liquid, the delivery mechanism may be a pump. When the precursor source comprises a solid, the delivery mechanism may be one of a mill, a conveyor, and combinations thereof. Further, a liquid solution may be provided and any solvent evaporated therefrom. Then, the resultant solid may be provided by, for example, a conveyor.

In FIG. 2, a small diameter tube (about 10 mils in this example) is used to maintain a high foreline pressure ahead of the vaporizer 44. In this aspect of the invention, an assist vehicle 47 may be fed as shown in FIG. 2 (e.g., this may be done using a Tee not explicitly depicted in FIG. 2) to maintain a relatively high foreline pressure. To keep the gas pressure high, a small diameter tube is used, and a flow of an assist vehicle 47 prevents blockage, thereby allowing the precursor flow. The assist vehicle 47 feeding also leads to a spray of the liquid precursor as fine mist, which can be vaporized better than liquid droplets. One way that this results in improvement in the precursor supply system 16 is by mitigating or even preventing the precursor from being fed into vaporizer 44 in a form of a droplet. In turn, precursor vaporization is uniform and, thus, precursor is supplied uniformly over time.

In a precursor supply system 16 using a liquid precursor delivery scheme, solid precursors are dissolved in a solvent to form a precursor source 40 in the form of a liquid solution. Then a delivery mechanism 42, in communication with the precursor source 40, transfers precursor into a vaporizer 44 where the solution is flash vaporized. One example of a delivery mechanism 42 is a pump such as an accurate metering pump. The use of the assist vehicle 47 substantially eliminates the difficulty of supplying liquid precursor for long time periods in a stable manner into a vaporizer 44 kept at high temperature in a vacuum where preferential evaporation of solvent and condensation of solid precursor previously had occurred at the tube supplying precursor and that could result in the clogging of the tube. Using the assist vehicle 47 permits the production of long length superconductor-coated conductors with substantially uniform properties, while at the same time substantially eliminating clogging problems, large droplet size, and fluctuations of precursor concentration.

We have obtained HTS film with a high Jc over about 2 $MA/cm^2$ using this new precursor feeding configuration reproducibly. More importantly, it was also possible to operate the MOCVD system in stable manner over time periods of over 30 hours continuously.

The CVD apparatus 10 is usable in the manufacture of elongate superconducting conductors by depositing a superconducting (e.g., LTS material, HTS material, and combinations thereof) or a non-superconducting material (e.g., buffer materials) on an elongate substrate 18, such as a tape-like structure. Examples of an elongate substrate 18 that may be used in a CVD apparatus 10 of the present invention include, without limitation, a substrate such as any of those disclosed in U.S. Pat. Nos. 6,610,632; 6,541,121; 6,383,989; and 5,872,080; U.S. Pat. Nos. 6,610,414; 6,610,413; 6,607,839; 6,607,838; 6,602,313; 6,599,346; 6,451,450; 6,447,714; 6,331,199; 6,156,376; 6,106,615; 5,964,966; 5,958,599; 5,898,020; 5,741,377; and 5,739,086; and U.S. Pat. Nos. 6,562,761; 6,475,311; 6,458,223; 6,426,320; 6,027,564; and 6,022,832 (the disclosure of each being hereby incorporated by reference in their entirety). Some of these examples of substrates 18 include barrier materials that, among other things, act as a seed to allow the formation of an HTS material. Others of these examples of substrates 18 have an appropriate texture to act as a seed to allow the formation of an HTS material. Texturized substrates and the attendant methods for making the same include those disclosed in U.S. Pat. Nos. 6,610,414; 6,610,413; 6,607,839; 6,607,838; 6,602,313; 6,599,346;

6,451,450; 6,447,714; 6,331,199; 6,156,376; 6,106,615; 5,964,966; 5,958,599; 5,898,020; 5,741,377; and 5,739,086 by Goyal et al. and U.S. Pat. Nos. 6,562,761; 6,475,311; 6,458,223; 6,426,320; 6,027,564; and 6,022,832 by Fritzemeier et al. (the disclosure of each being hereby incorporated by reference in their entirety).

Turning now to the precursor injector 24 and its parts and peripherals, the reader's attention is directed to FIGS. 3A, 3B, 3C, 4A, and 4B. For example, the longitudinal flow distributor 26 of the precursor injector 24 includes an entrance 52, a receiver volume 54, a distribution member 56, a distribution volume 60, and a plurality of exits 62. The entrance 52 may communicate with a vapor delivery 48 such as one or more tubes. The distribution member 56 may be a perforated member having, for example, a density of 1 to 10 holes per inch.

The precursor injector 24 provides that precursor in a more desirable manner when the distribution volume 60 is less than the receiver volume 54. Also, Applicants have found that making the receiver volume 54 greater than a total volume of perforations in the internal distribution member 56 is beneficial. Further, Applicants have found that a total volume of the perforations greater than the distribution volume 60 provides an advantage. The vapor delivery 48 communicates with the entrance of the precursor injector 24. Applicant have found that it is beneficial for a volume of the vapor delivery 48 to be greater than the receiver volume 54.

Figure 4A:
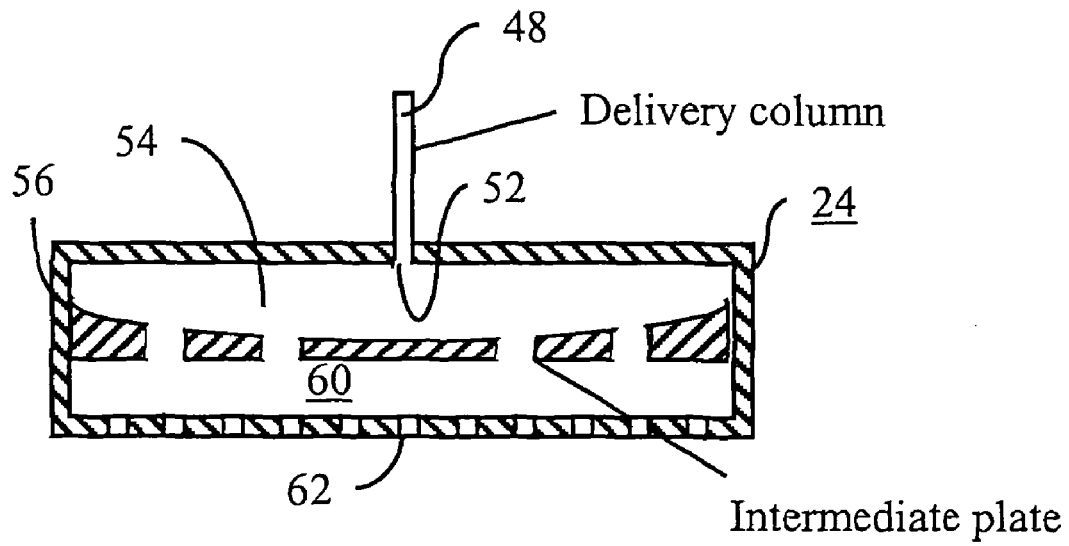
FIG. 4A is a cross-sectional schematic illustrating a longitudinal view of an alternative injector usable in the CVD apparatus of FIG. 1.
Figure 4B:
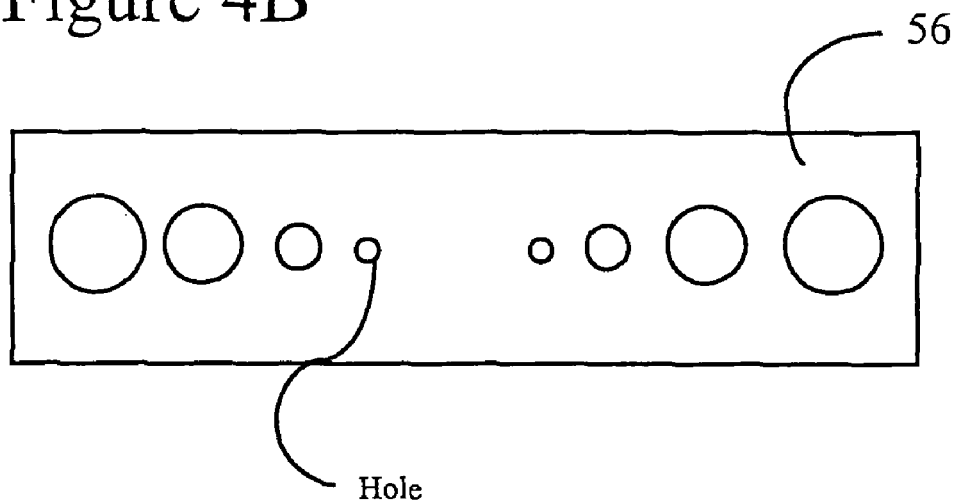
FIG. 4B is a sectional view illustrating an alternative perforated member usable in the injector of FIG. 3A.

Concerning other aspects of the precursor injector 24, when the entrance 52, such as a tubular passage, is substantially in the center of the injector 24, Applicants have found that an equal volume of perforations on both sides of the entrance 52 is beneficial. Further, Applicants have found that it may be desirable for the volume of perforations to increase in an increasing direction from the entrance 52. For example as shown in FIG. 4B, the volume of perforations may be increased by increasing the diameter of the perforations in an increasing direction from the entrance 52. Alternatively, as shown in FIG. 4A, the volume of perforations may be increased by increasing the thickness of the internal distribution member 56 in an increasing direction from the entrance 52.

Figure 3A:
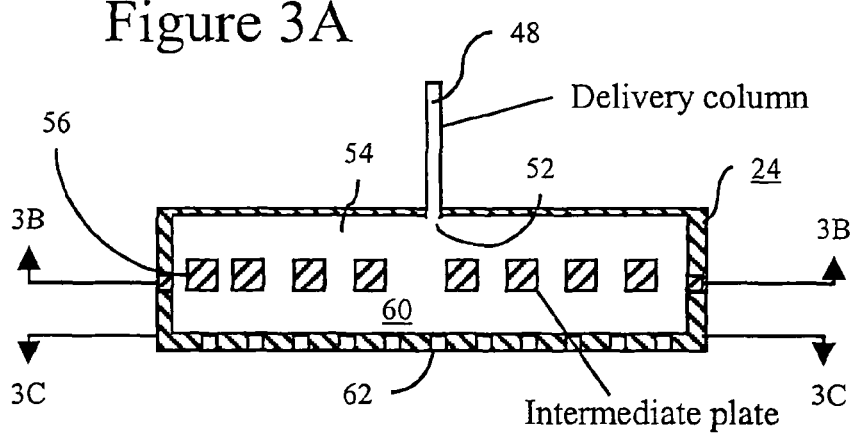
FIG. 3A is a cross-sectional schematic illustrating a longitudinal view of an injector usable in the CVD apparatus of FIG. 1.
Figure 3B:
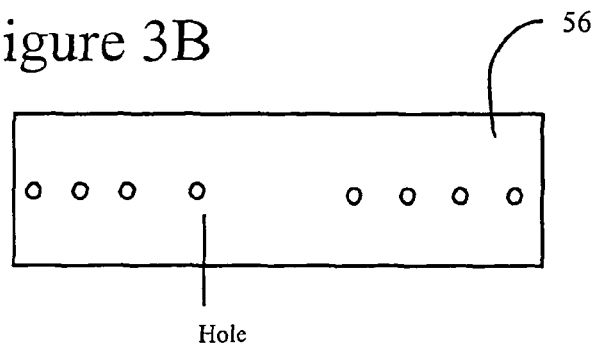
FIG. 3B is a sectional view illustrating a perforated member usable in the injector of FIG. 3A.
Figure 3C:
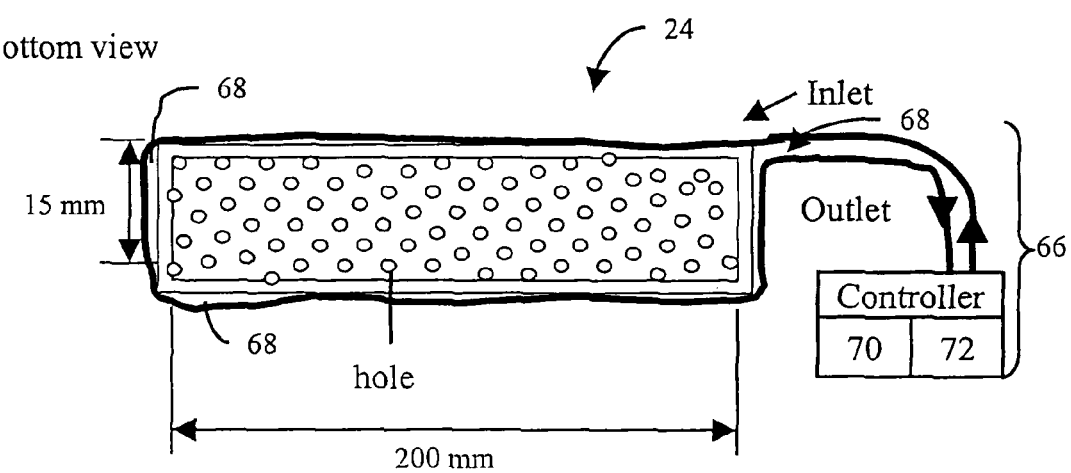
FIG. 3C is a sectional view illustrating a bottom view usable in the injector of FIG. 3A.

Turning now to FIG. 3C, it may be advantageous for the precursor injector 24 to include a temperature regulation system 66. At least one and, optionally, a plurality of temperature sensors 68 may communicate with the precursor injector 24 as part of the regulation system 66. The temperature regulation system 66 for the injector 24 may further include one of a heat source 70, a cooler 72, and combinations thereof.

Figure 5A:
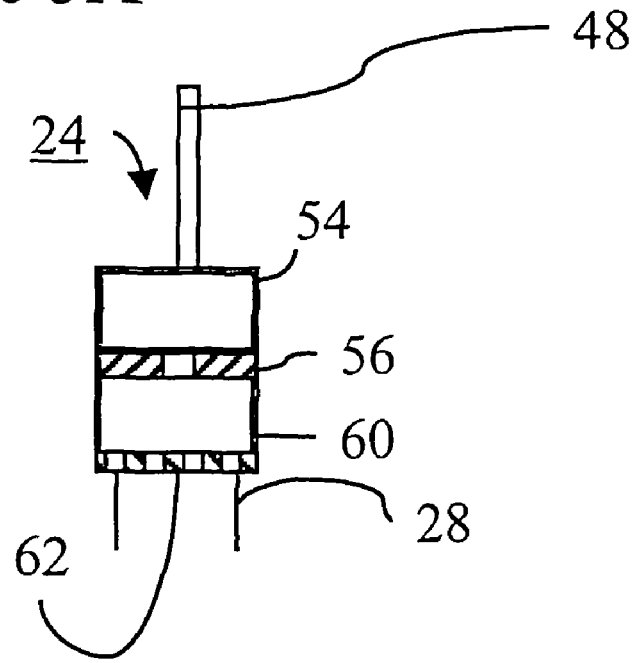
FIG. 5A is a cross-sectional schematic illustrating a transverse view of an alternative injector including lateral flow restrictor usable in the CVD apparatus of FIG. 1.
Figure 5B:
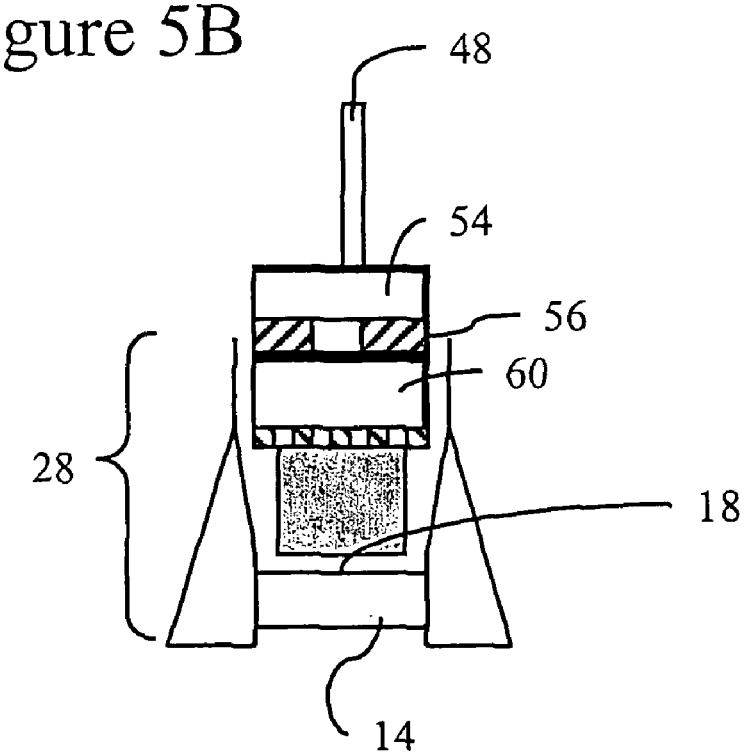
FIG. 5B is a cross-sectional schematic illustrating a transverse view of an alternative injector including an alternative lateral flow restrictor usable in the CVD apparatus of FIG. 1.

As shown in FIGS. 1 and 5A, the lateral flow restrictor 28 of the precursor injector 24 may be a physical extension of the precursor injector 24. Alternatively, as shown in FIG. 5B, the lateral flow restrictor 28 may be a gas curtain emanating from the precursor injector 24. In either case, the lateral flow restrictor 28 is spaced relative to the substrate heater 14 in a manner so as to permit exhausting of reaction products from the surface of the elongate substrate 18.

Returning now to FIG. 1, the substrate heater 14 includes at least one heat source 14A. As noted, the heat source 14A may heat the elongate substrate 18, directly, indirectly, or directly and indirectly. The heat source 14A may be any of one of the many that are commercially available such as for example, infrared heating, induction heating, convective heating, microwave heating, radiation heating, and the like. FIG. 1 schematically depicts a plurality of lamps in the left portion of the substrate heater 14, such as commercially available quartz-infrared heating lamps available from CVD Equipment Corporation, Ronkonkoma, N.Y. and resistance-heating elements in the central and right portions of the substrate heater 14, such as refractory metal elementals available from Structured Materials Industries, Inc., Piscataway, N.J. During the deposition process, the temperature of the elongate substrate 18 is properly controlled via the substrate heater 14. The substrate heater 14 may be a single- or multiple-zone substrate heater that provides heating, typically in the range of between about 700 to 950° C., to the elongate substrate 18 via a radiant heating element, such as an infrared lamp. Alternatively, the substrate heater 14 is a resistance heater via a heating element, such as Kanthal or $MoSi_2$.

In FIG. 1, the substrate heater 14 is depicted having a susceptor 32 and being heated by the heat source 14A. The susceptor 32 in turn heats the substrate 18. As noted, the susceptor 32 may be configured to have a sufficient thermal inertia so as to maintain the elongate substrate 18 at a temperature that permits the deposition surface of the substrate 18 to be at the deposition temperature. Having a sufficient thermal inertia may be particularly advantageous for a substrate that is constantly being moved beyond the substrate heater 14. Applicants have found that including a radius of curvature in the design of the susceptor 32 is particularly advantageous. Such a radius of curvature accommodates the elongate substrate and, in particular, the contacting communication of the translating elongate substrate 18 and the susceptor 32.

Although the substrate heater 14 in FIG. 1 is depicted as being a multiple-zone heater, the substrate heater 14 may be a single-zone heater. Using a multiple-zone heater may be particularly advantageous for keeping a temperature at a growth surface of the translating tape at a prescribed reaction temperature, typically in the range of 700 to 950° C. when forming an HTS material. It will be appreciated that as material is deposited on the surface of the substrate 18, the heat transfer properties of the substrate 18 change. The change may be attributed to an increase in thickness and a change in material composition. Thus, if the CVD apparatus 10 is operated to form a coating on a substrate 18 by a translation of substrate 18 from left to right, then the temperature of a susceptor 32 at a left end may be the first temperature to accomplish the desired prescribed reaction temperature and at a second temperature at a right end to accomplish the desired prescribed reaction temperature. The temperature of the susceptor at locations between the left end and the right end then may be somewhere between the first temperature and the second temperature to have the temperature at the growth surface of the translating tape at a prescribed reaction temperature.

In addition to, or rather than the substrate heater 14 being used, one or more surface heaters 34 may be included in a CVD apparatus 10. Each surface heater 34 is positioned so as to maintain a temperature at the growth surface on the substrate 18 at a prescribed reaction temperature. FIG. 1 shows a surface heater 34 at the left end and another surface heater 34 at the right end of the substrate heater 14. It will be appreciated that the surface heater 34 may be used in combination with a substrate heater 14 whether it is a single-zone heater or a multiple-zone heater. Surface heaters 34 of FIG. 1 are lamp-type heaters, such as for example, quartz-infrared lamps available from CVD Equipment Corporation, Ronkonkoma, N.Y.

Another use of surface heaters 34 as shown in FIG. 1 is to lengthen an amount of the surface of the translating tape at a prescribed reaction temperature that supports growth of the desired product. For example, a substrate heater 14 substantially as depicted in FIG. 1 having a length of about 32 centimeters (cm) maintained about 12 cm of a translating substrate made of HASTELLOY® C-276 nickel alloy or INCONEL® nickel alloy (measuring between about 50 to about 100 .mu.m thick and between about 10 to about 13 mm wide) at a prescribed reaction temperature. By adding auxiliary heaters 34 as schematically shown in FIG. 1, about 25 cm of the about 32 cm were the prescribed reaction temperature. At least two benefits realized by having an increased length at a prescribed reaction temperature include a faster process for the growth surface at temperature and a more uniform zone in which growth occurs.

Figure 7:
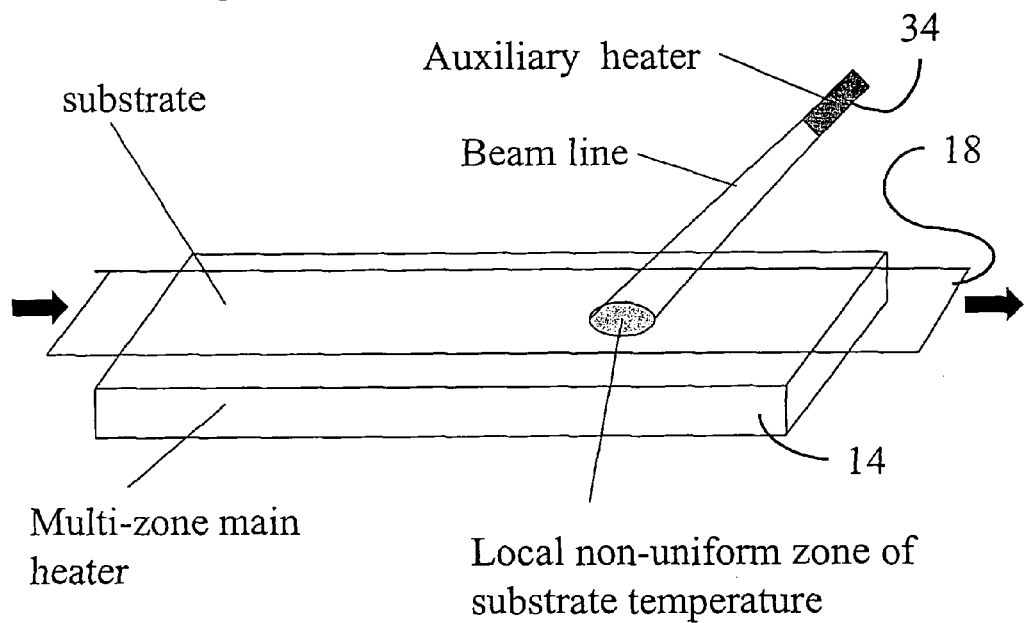
FIG. 7 is a schematic illustrating an alternative use of an auxiliary heater in providing for the uniform heating of an elongate substrate and usable in the CVD apparatus of FIG. 1.

Yet another use of an auxiliary heater 34 is depicted in FIG. 7. Here, the substrate heater 14, for whatever reason, does not heat the substrate 18 uniformly. To remedy the non-uniformity, an auxiliary heater 34 is directed to the area that is insufficiently heated to provide additional heating to create a more uniform heating of the substrate at a prescribed reaction temperature.

Figure 6:
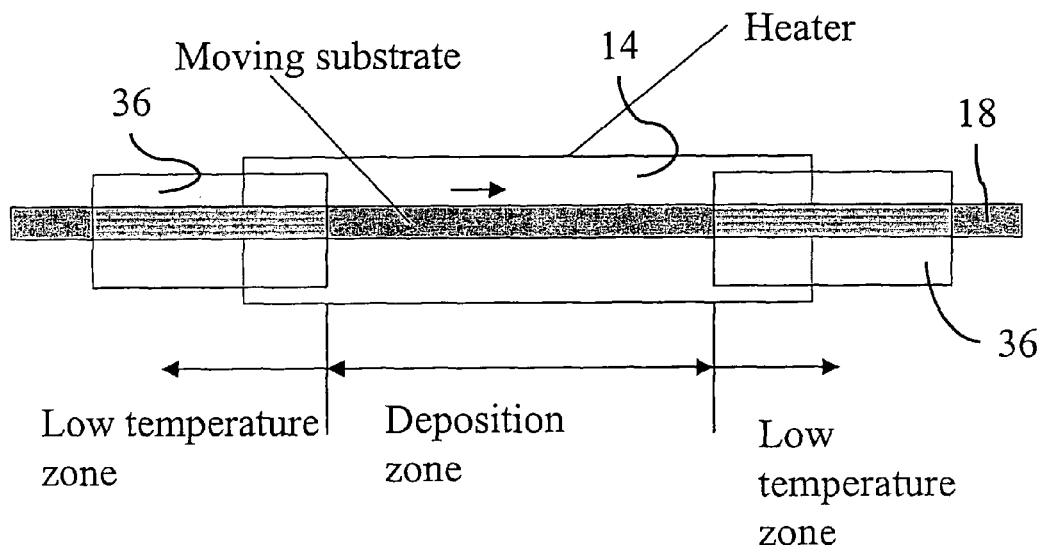
FIG. 6 is a schematic illustrating a top view of the arrangement of the substrate shields, the substrate heater, and the elongate substrate of the CVD apparatus of FIG. 1.

Referring to FIG. 1 and FIG. 6 relating to shields 36, Applicants have found that it may be advantageous to include one or more shields 36 to shield portions of a translating substrate 18 at a temperature lower than a prescribed reaction temperature. In using shields 36, Applicants have found that their placement is such so as to protect the translating substrate 18 from the precursor composition before the growth surface is at a prescribed reaction temperature, while at the same time, the placement is such so that the temperature of the substrate 18 and any coatings deposited thereon do not exceed the prescribed reaction temperature.

The CVD apparatus 10 includes at least one precursor supply system 16. FIG. 1 shows schematically the general arrangement of the precursor supply system 10, the reactor 12, and the injector 24. The reactor 12 is a vacuum-sealed deposition chamber in which an MOCVD process occurs, such as a cold-wall reactor that may be maintained at a pressure of, for example, about 1.6 Torr. As noted above, FIG. 2 provides details of the precursor supply system 16, namely, that it includes a precursor source 40, a delivery mechanism 42, and a vaporizer 44. At least one vehicle 46 is in communication with the vaporizer 44 to transport vaporized precursor to the substrate 18 via the injector 24. In constructing a precursor supply system 16, a solution of metalorganic compounds in an appropriate solvent as discussed below is used.

The delivery mechanism 42 that provides the solution to the vaporizer 44 may be a pump capable of a low flow rate between 0.1 and 10 mL/min. An example of a suitable pump includes a high-pressure, low flow rate pump, such as a high-pressure liquid chromatography (HPLC) pump including an about 10 mil, i.e., about 254 micrometer (μm), the inner diameter tube made of a TEFLON® fluoropolymer.

The vaporizer 44 is a commercially available unit such as those available from Cova Technology, Colorado Springs, Colo. The vaporizer 44 may be constructed and arranged as more fully described in U.S. Pat. No. 5,204,314 issued Apr. 20, 1993 to Peter S. Kirlin et al.; U.S. Pat. No. 5,536,323 issued Jul. 16, 1996 to Peter S. Kirlin et al.; and U.S. Pat. No. 5,711,816 issued Jan. 27, 1998 to Peter S. Kirlin, et al. (the disclosure of each being hereby incorporated by reference in their entirety).

The at least one vehicle 46 may be provided as a gas that is capable of carrying the vaporizer precursor to the substrate 18 through the injector 24. Gases that are inert with respect to the precursor composition are appropriate. Such gases include argon and may include nitrogen. As the vaporized precursor travels to the injector 24, an oxygen-containing gas, such as any one of oxygen, water vapor, nitrogen oxides, and combinations thereof may be added to the vaporized precursor to form an oxide coating on the substrate 18.

Although the precursor source 40 of FIG. 2 is a solution, the precursor supply system 16 may be any of the type known in the art such as for example, a solid, liquid, and combinations thereof. A solid precursor source may be provided as a mass, a powder, and a mass that is subsequently powdered. A liquid precursor source may be provided in a solvent-based manner, a solventless-based manner, and combinations thereof.

For example, U.S. Pat. No. 5,820,678 (the disclosure being hereby incorporated by reference in its entirety), issued to Hubert, et al., entitled "Solid Source MOCVD System," describes a system for MOCVD fabrication of superconducting and non-superconducting oxide films that includes multiple cartridges containing tightly packed precursor materials that are ground and vaporized for thin film deposition. Also as an other example, C. Jimenez et al. disclose in "Characterization of a solvent-free vapour source for MOCVD" published in J. Physique IV France 11 (2001 Pr3-669) a system that permits the separation of a solvent from the precursors before introducing the precursors vapours into a deposition chamber. The disclosure of C. Jimenez et al. is hereby incorporated by reference in its entirety.

The aforementioned show that when the precursor source 40 comprises a solid, the delivery mechanism may be one of a mill, a conveyor, and combinations thereof. Further, a liquid may be provided and any solvent evaporated therefrom. Then, the resultant solid may be provided by, for example, a conveyor.

Examples of categories of metalorganic compounds usable as precursors include: metal β-diketonates, such as M(thd)y (where thd may be a tetramethylheptanedione such as 2,2,6,6-tetramethyl-3,5-heptanedionate), M(thd)y(OR)z (where thd may be a tetramethylheptanedione such as 2,2,6,6-tetramethyl-3,5-heptanedionate and R may be an alkyl group), and M(acac)y (where acac may be an acetylacetonate such as 2,4-pentanedionate); alkoxides, such as ethoxide (OEth), isopropoxide (i-OPr), and butoxide (n-OBut); alkylmetal; and carboxylates, such as benzoate and ethylhexanoate (eha). M may be any one of RE, Ba, and Cu. RE is a first rare earth element of any one of Y, La, Nd, Sm, Eu, Gd, Dy, Ho, Er, Tm, Yb, Lu, and combinations thereof. When associated with a non-superconducting oxide, such as for example, a buffer layer, M may be any one of Ga, Sr, Ti, Al, La, Mn, Ni, Nb, Mg, Zr, Ce, others rare-earths (RE) and combinations thereof. When a solution is used, any appropriate solvent that is compatible with the metalorganic compounds may be used. For example, any one of tetrahydrofuran (THF), isopropanol, and combinations thereof may be used with M(thd)y.

The delivery mechanism provides the precursors to the vaporizer in a predetermined amount. When the precursor source comprises a liquid, the delivery mechanism may be a pump.

The CVD apparatus 10 of FIG. 1 includes an exhaust system 20. The exhaust system 20 is for removing reaction products from the elongate substrate surface 18. In this manner, precursor provided by the injector 24 may more effectively reach the surface of the elongate substrate 18 to facilitate the growth of a coating. The exhaust system 20 may include a vacuum system in communication with the reactor 12.

The vacuum pump may be connected to the reactor 12. The vacuum pump is a commercially available vacuum pump capable of maintaining a vacuum of pressure in the order of magnitude of about $10^{-3}$ Torr, such as a Leybold model D65B. Alternatively, the function of the vacuum pump may be accomplished by a combination of a mechanical pump and a mechanical booster, such as Edwards model EH500, in order to obtain the proper vacuum suitable for use with a large amount of liquid precursor.

The CVD apparatus 10 may further include a gas supply 22 that in turn communicates with a mass flow control mechanism 50. The gas supply 22 provides the gas for the carrier fluid supply 46 that communicates with the vaporizer 44 of the precursor supply system 16. As noted, the carrier fluid may include an inert gas, such as argon, a reactive gas, such as one of oxygen and nitrogen oxide, and combinations of inert gases and reactive gases.

As the CVD apparatus 10 is usable in the manufacture of superconducting conductors, it includes a substrate translation mechanism 70 such as a tape handler. Examples of usable substrate translation mechanisms 70 include at least one of a conveyor, a reel-to-reel unit, a robotic translator, and combinations thereof.

A conventional stepper or AC vector drive motor may be used to drive the payout spool and take-up spool of the tape handler. In other applications, AC motors (synchronous or variable frequency) or DC motors (brushed, brushless serve) and drives may be used. The motor is selected to be capable of providing the required translation speed of the elongate substrate 18. Also, the motor may have the ability to move the elongate substrate 18 in user-specified increments and to reverse the direction of the elongate substrate 18. The take-up spool and the payout spool each may be driven by a conventional torque motor that assists in providing the proper tension to the elongate substrate 18 as it translates through the CVD apparatus 10.

A shown in FIG. 1, at least one controller 30 may be part of the CVD apparatus 10, for example, to coordinate the operation of its various parts, components, and peripherals. The controller 30 of FIG. 1 is depicted as being in communication a plurality of valve, the zone of the substrate heater 14, the precursor supply 16, the exhaust system 20, gas supply 22, the injector 24, the auxiliary heaters 34, the mass flow regulator 50, and the translation mechanism 74.

The controller 30 is a commercially available controller with a plurality of inputs and outputs that meet the requirements of the peripherals. The controller 30 may be a microcontroller or a PC with appropriate hardware and software. Details concerning controllers that may be used with the CVD apparatus 10 are discussed in, for example, U.S. Pat. Nos. 5,980,078; 5,726,912; 5,689,415; 5,579,218; 5,351,200; 4,916,600; 4,646,223; 4,344,127; and 4,396,976, the entire disclosure of each being incorporated by reference herein.

Further, to facilitate the operation of the CVD apparatus 10, its various parts, components, and peripherals, at least one sensor is in communication with the at least one controller 30. Examples of the at least one sensor include any one of a flow meter, a species monitor, a deposition sensor, a temperature sensor, a pressure sensor, a vacuum sensor, a speed monitor, and combinations thereof. Some specific examples of use of the at least one controller include regulating: the precursor supply system 16, at least one precursor injector 24, a translational speed of the elongate substrate 18, and combinations thereof Examples of elongate substrates that may be inspected in a CVD apparatus 10 of the present invention include, without limitation, a substrate such as any of those disclosed in U.S. Pat. Nos. 6,610,632; 6,541,121; 6,383,989; and 5,872,080; U.S. Pat. Nos. 6,610,414; 6,610,413; 6,607,839; 6,607,838; 6,602,313; 6,599,346; 6,451,450; 6,447,714; 6,331,199; 6,156,376; 6,106,615; 5,964,966; 5,958,599; 5,898,020; 5,741,377; and 5,739,086; and U.S. Pat. Nos. 6,562,761; 6,475,311; 6,458,223; 6,426,320; 6,027,564; and 6,022,832 (the disclosure of each being hereby incorporated by reference in their entirety). For the manufacture of an HTS conductor, the elongate substrate 18 is formed of metals, such as stainless steel or a nickel alloy such as HASTELLOY® or INCONEL®, that are capable of withstanding high temperatures and vacuum conditions. The elongate substrate 18 is typically between about 3 to about 60 millimeters (mm) in width and upwards of several hundred meters in length. Applicant contemplates that the elongate substrate 18 may be any width between about 1 mm and 100 mm. After processing, an elongate substrate 18 may be sliced into a plurality if tapes having lesser widths. For example, an about 60 mm wide, processed elongate substrate 18 may be sliced in a manner that produces four about 15 mm wide tapes. In a like manner, an about 12 mm wide processed tape may be sliced in a manner that produces four about 3 mm wide tapes. Thus, Applicants contemplate that the elongate substrate 18 may include any width between 1 and 100 mm, such as for example 4 mm, 5 mm, 10 mm, 11 mm, 12 mm, 98 mm, and 99 mm. The elongate substrate 18 typically has several meters of "leader" at both ends to aid in handling.

In operation of CVD apparatus 10, a user first activates the translation of the elongate substrate 18 by the tape translation mechanism 74.

Those skilled in the art will appreciate that the morphology of the deposited HTS film may change as a function of several variables, such as but not limited to:

Deposition temperature: HTS film surface roughness is affected by the deposition temperature;

Precursor composition: for example, the molarity (concentration) of the precursor affects the morphology of the film, e.g., a barium-deficient film has a morphology that differs from a barium-rich film as well as a stoichiometric film;

Precursor delivery rate: for example, the first layer deposited is continuously exposed to a high temperature as it translates through the deposition zone 118, which may cause damage to the morphology of this first layer in the time it takes to translate through the entire deposition zone 118. Increasing the precursor delivery rate for subsequent layers will shorten the time that the first layer experiences this high heat and may thereby minimize potential damage.

Oxygen partial pressure: It is necessary to prepare the film under a different oxygen partial pressure and substrate temperature. For example, where the precursor delivery rate is increased twice from 0.25 to 0.5 ml/min, good performance is obtained when 0.5 Torr higher oxygen partial pressure is used. Oxygen partial pressure should be increased in accordance with the above example when the substrate temperature is increased. Oxygen partial pressure can be determined empirically depending on processing parameter changes, such as the distance between the multi-compartment showerhead 112 and the elongate substrate 18, the exposure of UV light to source vapor, or the use of atomic oxygen or ozone as an oxidant.

Specific analysis of some of the variables affecting the morphology of the HTS film is provided below.

It has been demonstrated that, assuming a delivery rate of about 0.25 mL/min and a deposition temperature of about 800° C., an increase in the precursor molarity (i.e., the number of moles of solute per liter of solution) of the precursor results in an increase in film thickness for a deposition time of 20 minutes. For example:

a molarity of about 0.03 mol/L yields a film thickness of about 1.0 micron;

a molarity of about 0.045 mol/L yields a film thickness of about 1.3 microns; and a molarity of about 0.06 mol/L yields a film thickness of about 1.75 microns. It has been demonstrated that, assuming a precursor molarity of about 0.03 mol/L and a deposition temperature of about 800° C., an increase in the precursor delivery rate also results in an increase in film thickness. For example:

a delivery rate of about 0.25 mL/min yields a film thickness of about 1.0 micron;

a delivery rate of about 0.5 mL/min yields a film thickness of approximately about 2.0 microns; and a delivery rate of about 1 mL/min yields a film thickness of approximately about 4.0 microns.

It has been demonstrated that, assuming a deposition temperature of about 800° C., varying the combination of the precursor delivery rate, the precursor molarity, and the oxygen partial pressure affects the critical current (Jc) value of the resulting film. For example:

Example 1: a delivery rate of 0.25 mL/min, combined with a molarity of about 0.03 mol/L, combined with an oxygen partial pressure of about 0.56 Torr yields a critical current of about 2.7 MA/cm$^2$ for an about 0.6 micron thick film (Example 1);

Example 2: a delivery rate of about 0.50 mL/min, combined with a molarity of about 0.03 mol/L, combined with an oxygen partial pressure of about 0.56 Torr yields a critical current of about 0 A/cm$^2$ for an about 0.6 micron thick film (the same thickness of film was obtained even though the deposition time was reduced to half that of Example 1);

Example 3: a delivery rate of about 0.5 mL/min, combined with a molarity of about 0.03 mol/L, combined with an oxygen partial pressure of about 1.08 Torr yields a critical current of about 2.5 MA/cm$^2$ for an about 0.6 micron thick film (the same thickness of film was obtained, even though the deposition time was reduced to half that of Example 1); and Example 4: a delivery rate of about 0.5 mL/min, combined with a molarity of about 0.06 mol/L, combined with an oxygen partial pressure of about 1.08 Torr yields a critical current of about 2.2 MA/cm$^2$ for an about 0.6 micron thick film (the same thickness of film was obtained even though the deposition time was reduced to half that of Example 3).

Furthermore, precursor vapors and their inert carrier gas are efficiently delivered to the deposition zone within a temperature range of between about 230 and 300° C.

Lastly, the temperature of the elongate substrate 18 during the deposition process may affect the end properties. For example, high critical current (Jc) of about 35 A was obtained for the film with a thickness of about 0.35 microns that was prepared at about 800° C. (Jc=1 MA/cm$^2$). However, for a film having the same thickness but prepared at about 810° C. the Jc dropped to about 10 A.

Using the example of FIG. 1, parameters, including those outlined above, that may affecting the film deposition process within CVD apparatus 10 are given in Table 1 below.

TABLE 1

| Parameters regarding CVD apparatus 10 | | |
|---|---|---|
| | Acceptable examples or acceptable range | Narrower acceptable examples or acceptable range |
| Liquid organometallic precursor solution within the precursor supply system 16 | THD compounds of Y, Ba, and Cu with a molar ratio of Y: about 1 Ba: between about 1.8 & 2.6 Cu: between about 2.5 & 3.5, with solvents, such as tetrahydrofuran and isopropanol. Alternately, THD compounds of Sm (or Nd, Eu), Ba, and Cu with a molar ratio of Sm (or Nd, Eu): about 1 Ba: between about 1.8 & 2.6 Cu: between about 2.5 & 3.5. Alternately, part of Y is substituted with Sm (or Nd, Eu) up to 50%. | THD compounds of Y, Ba, and Cu with a molar ratio of Y: about 1 Ba: between about 1.9 & 2.5 Cu: between about 2.8 & 3.2, with solvents, such as tetrahydrofuran and isopropanol. Alternately, THD compounds of Sm(or Nd, Eu), Ba, and Cu with a molar ratio of Sm(or Nd, Eu): about 1 Ba: between about 1.9 & 2.5 Cu: between about 2.8 & 3.2. Alternately, part of Y is substituted with Sm (or Nd, Eu) up to 50%. |
| Molarity of the precursor solution within precursor supply system 16 | Between about 0.015 & 0.070 mol/L | Between about 0.050 & 0.070 mol/L |
| Temperature of the liquid precursor solution within precursor supply system 16 | Between about 200 & 300° C. | Between about 250 & 270° C. |
| Liquid flow rate via precursor supply system 16 | Between about 0.1 and 10 mL/min | Between about 0.5 & 5 mL/min |
| Flash vaporization temperature within vaporizer 44 | Between about 200 & 300° C. | Between about 250 & 270° C. |
| Inert gas pressure | Between about 16 & 30 psi | Between about 16 & 20 psi |
| Partial oxygen | Between about 0.4 & 5 Torr | Between about 0.5 & 3 Torr |
| Vapor precursor temperature via the precursor vapor line 48 | Between about 200 & 300° C. | Between about 250 & 270° C. |
| Length of precursor injector 24 | Between about 10 & 30 cm | Between about 15 & 20 cm |
| The substrate tape 18 temperature via heating with substrate heater 14 | Between about 700 & 950° C. | Between about 750 & 820° C. |
| The substrate tape 18 translation rate | Between about 0.25 & 40 cm/min | Between about 1 & 40 cm/min |
| Resulting HTS film thickness | Between about 0.5 & 10 microns | Between about 3 & 10 microns |

Figure 8:
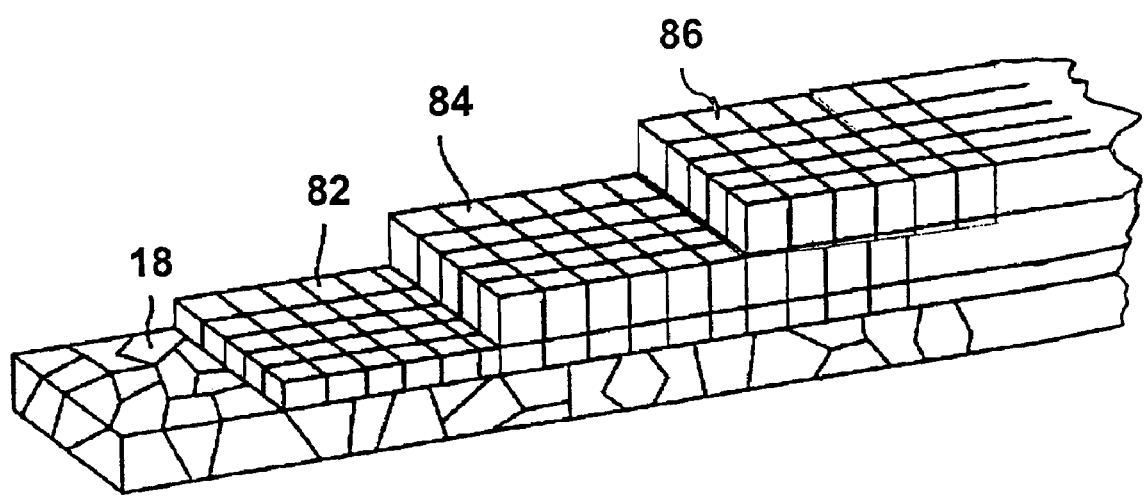
FIG. 8 illustrates a cutaway view of an example HTS conductor formed via the CVD apparatus 10 of FIG. 1.

The detailed operation of the CVD apparatus 10 is described using an example HTS-coated tape as shown in FIG. 8.

FIG. 8 illustrates a cutaway view of an example HTS conductor 80 formed via the CVD apparatus 10 of FIG. 1. The HTS conductor 80 includes an elongate substrate 18, such as a metallic material. Suitable metallic materials include, but are not limited to, steel, nickel, nickel alloys, and alloys of copper, iron, and molybdenum. The elongate substrate 18 may be lattice-matched to the oxide superconductor, such as by the deformation texturing of the elongate substrate 18. Alternatively, the elongate substrate 18 is coated with a buffer layer 82 that contains some degree of crystallographic alignment and which is reasonably lattice-matched with the oxide superconductor. The buffer layer 82 has an epitaxial oxide superconductor layer 84 deposited thereon. Suitable compositions for the buffer layer 82 include but are not limited to, zirconia, YSZ, $LaAlO_3$, $SrTiO_3$, $CeO_2$, and MgO, preferably ion-beam assisted deposition (IBAD) YSZ, $LaAlO_3$, $SrTiO_3$, $CeO_2$, and MgO. For example, the elongate substrate 18 may be a flexible length of substrate formed from a variety of metals, such as stainless steel or a nickel alloy such as HASTELLOY® or INCONEL®, upon which buffer layers, such as yttria-stabilized zirconia (YSZ) and/or cerium oxide ($CeO_2$) have been previously deposited with a bi-axial texture, for instance, a (100)<001> cube texture. The oxide superconductor layer 84 desirably has a thickness in the range of greater than or equal to about 0.5 microns (μm), preferably greater than or equal to 0.8 microns (μm) and most preferably greater than or equal to 1.0 microns (μm). When the elongate substrate 18 is lattice-matched to the oxide superconductor, the superconductor layer 84 is deposited as one or more layers to the desired thickness on the elongate substrate 18 to form an HTS film, such as YBCO, via the CVD apparatus 10 of FIG. 1. Alternatively, when the elongate substrate 18 is coated with a buffer layer 82 that contains some degree of crystallographic alignment that is reasonably lattice-matched with the oxide superconductor, the superconductor layer 84 is deposited as one or more layers to the desired thickness on the buffer layer 82 to form an HTS film. Finally, the superconductor layer may be covered by a noble metal layer 86.

With reference to FIGS. 1, 2, 3A, 3B, 3C, 4A, the operation of the CVD apparatus 10 of the present invention is as follows.

Sufficient vacuum is developed within the reactor 12 by activating the exhaust system 20. The linear translation of the elongate substrate 18 through the deposition zone begins in a direction progressing from left to right. (The mechanisms for translating the elongate substrate 18 are tape translation mechanism 74.) All heating elements within the substrate heater 14 are activated to provide the desired temperature to the elongate substrate 18 according to Table 1.

The liquid source 40 contains a liquid organometallic precursor solution according to Table 1. The pump 42 is activated to feed the liquid precursor from the liquid source 40 into the vaporizer 44. There, the solution is flash vaporized and then mixed with a carrier fluid, such as argon or nitrogen, feeding into the vaporizer 44 from the carrier fluid supply 46 to form a superconductor (e.g., yttrium-barium-copper-oxide ($YBa_2Cu_3O_7$ or "Y123") or samarium-barium-copper-oxide ($SmBa_2Cu_3O_7$ or "Sm123") precursor vapor. The superconductor precursor vapor from vaporizer 44 is then carried to the reactor 12 through a line via a delivery column 48 to the precursor injector 24. The line, delivery column 48, and precursor injector 24 are maintained at an appropriate temperature, according to Table 1, via heating coils (not shown). Additionally, oxygen is introduced to the line just prior to the superconductor precursor vapor entering the reactor 12 via an oxygen line coming from mass flow regulator 50.

Having activated the deposition process within the reactor 12 of the CVD apparatus 10, and having set all control parameters according to Table 1, the HTS conductor 80 is formed as follows.

A line delivers the superconductor precursor vapor to the delivery column 48 of the precursor injector 24 that uniformly directs this vapor precursor toward the elongate substrate 18 within the deposition zone. The result of the oxygen reacting with the superconductor precursor vapor, and then this reacting combination coming into contact with the hot elongate substrate 18 within the deposition zone, causes the superconductor precursor to decompose and form a layer of superconductor atop the elongate substrate 18 as it translates through the deposition zone. The defects within the layer are minimized via the control parameters according to Table 1.

Thus, the layer provides a high quality template for growing additional superconductor material or material such as silver or copper, which can be deposited by any film deposition method. As a result, the superconductor layer or, collectively, the superconductor layers or HTS layers corresponding to any alternate precursor used that form the HTS conductor 80 have a thickness of greater than about 2 microns with a critical current density of approximately greater than about 1 $MA/cm^2$.

As a result, the CVD apparatus 10 of the present invention is capable of producing a YBCO film or HTS corresponding to any alternate precursor used with a thickness in excess of about 1.5 microns that has increased material density and smoothness that results in increased current capacity of over at least about 150 A/cm width.

In an alternative embodiment, precursor may be delivered to multiple deposition zones of a CVD apparatus 10 by a multi-compartment precursor injector 24 to supply the precursor to the elongate substrate 18 as a single unit. Alternatively, precursor may instead be delivered to multiple deposition zones of a CVD apparatus 10 by a multiple precursor injector 24. Each compartment of a multi-compartment precursor injector 24 or separately installed precursor injectors 24 could have an associated separate heater for supplying heat to the elongate substrate 18.

In another alternative embodiment, multiple precursors may be delivered to the deposition zone of the CVD apparatus 10 by separately installed precursor injectors 24 to supply the separate precursors to the elongate substrate 18 instead of using multi-compartment precursor injectors 24 designed as a single unit. Each separately installed precursor injector 24 would have an associated separate heater for supplying heat to the elongate substrate 18.

The CVD apparatus 10 includes a precursor supply system 16. As shown in FIG. 2, the precursor supply system 16 comprises a liquid source 40 that is a reservoir formed of, for example, a metal or plastic vessel that contains a solution containing organometallic precursors, such as yttrium, barium, and copper, along with an appropriate mixture of solvents. The liquid source 40 feeds a delivery mechanism 42 such as for example, a pump, capable of a low flow rate between 0.1 and 10 mL/min. An example of a delivery mechanism 42 is a high-pressure, low flow rate pump, such as a high-pressure liquid chromatography (HPLC) pump. The delivery mechanism 42 feeds a vaporizer 44 that includes elements with which a precursor solution may be flash vaporized and mixed with an inert carrier gas, such as argon or nitrogen, for delivery to the precursor injector 24. The vaporized precursors exit the vaporizer. Just prior to the line entering the reactor 12, an oxygen line opens into the vapor line.

The oxygen line is a tube or pipe through which oxygen passes for introduction to the precursor vapors and their inert carrier gas flowing within the precursor vapor line. Each instantiation of the precursor vapor line enters the reactor 12 ready for delivery through the precursor injector 24 onto a substrate 18.

The CVD apparatus 10 includes an exhaust system 20 connected to the reactor 12. The exhaust system 20 is a commercially available vacuum pump capable of maintaining a vacuum of pressure in the order of magnitude of $10^{-3}$ Torr, such as a Leybold model D65B. Alternatively, the function of the exhaust system 20 may be accomplished by a combination of a mechanical pump and a mechanical booster, such as Edwards model EH500, in order to obtain the proper vacuum suitable for use with a large amount of liquid precursor.

The precursor supply system 16 and the exhaust system 20 are shown as being located external to the reactor 12. Additionally, those skilled in the art will appreciate that the CVD apparatus 10 further includes various sensing and control devices, such as pressure gauges and thermocouples, which are, for simplicity, not shown in FIGS. 1 and 2.

Samarium and yttrium belong to the same group within the periodic table of elements, which means that the samarium-barium-copper precursor behaves in a very similar manner to the yttrium-barium-copper containing precursor. As a result, the samarium-barium-copper superconducting compound may be deposited with similar deposition conditions as the yttrium-barium-copper superconducting compound. Such processing conditions include the temperature of the vapor lines between about 250 and 300° C., the elongate substrate 18 temperature of between about 700 and 950° C., the deposition pressure of between about 1 and 10 Torr, the oxygen partial pressure of between about 0.5 to 5 Torr, and the liquid precursor delivery rate of between about 0.25 and 10 mL/min. Since the yttrium-barium-copper precursor and the samarium-barium-copper precursor have similar properties, the heating or cooling requirements of the elements within the CVD apparatus 10 need no special design to accommodate the different materials.

In general, the thickness of each layer being deposited is determined by the combination of three factors: (1) the physical length, (2) precursor vapor delivery rate, and (3) its associated precursor molarity (i.e., concentration of the precursor solution). Additionally, the thickness of each film is directly proportional to each of these three factors. For example, the longer the physical length of its associated compartment, the thicker the film; the higher the associated vapor precursor delivery rate, the thicker the film; and the more concentrated the associated precursor solution, the thicker the film.

As one example of these controls, the thickness of the layer 84 may be determined by the combination of the physical length of the heater 14 within the precursor injector 24, the delivery rate of the samarium-barium-copper containing precursor, and the concentration of the samarium-barium-copper containing liquid precursor.

In the case of the YBCO single layer, research indicates that the critical current reaches a maximum and levels off at around about 1.5 microns because, as the film thickens, the surface roughness progressively increases, making a progressively poorer and poorer template for crystal growth and causing misaligned crystals, thereby inhibiting any increase in current flow. Additionally, the film becomes more porous as the film thickens, thereby inhibiting any increase in current flow.

By contrast, the Sm123 is a smoother film than YBCO. Thus, growing Sm123 atop a layer of YBCO reduces the surface roughness and makes a better template for growing any additional YBCO layers. The YBCO-Sm123 sequence may be repeated without limiting or inhibiting the flow of current; by contrast, a single thick layer of YBCO shows no more increase of current flow beyond a thickness of about 1.5 micron. Sm123 and YBCO are both superconducting materials with similar properties, so diffusion between layers should not pose a significant problem. See e.g., US patent application Publication Nos.: US 2001/0056041, "Architecture for high critical current superconducting tapes," Dec. 27, 2001; and US 2003/0036483, "High temperature superconducting thick films," Feb. 20, 2003 as well as U.S. Pat. No. 6,541,136, "Superconducting structure," Apr. 1, 2003 (the disclosure of each being hereby incorporated by reference in their entirety).

The formation of a multi-layer HTS-coated tape using the CVD apparatus 10 is not limited to YBCO with Sm123; other superconducting materials may be used. For example, other oxides that are chemically compatible to YBCO, such as RE123 (where RE=rare earth metals such as neodymium (Nd), europium (Eu), lanthanum (La), holmium (Ho), Gadolinium (Gd)), may be used. Additionally, an HTS-coated tape formed using the CVD apparatus 10 is not limited to any specific number of layers. The precursor injector 24 may be expanded to any number of compartments, as long as precursor delivery lines and pumps are sized to handle delivery to multiple zones at the proper delivery rate. Furthermore, the substrate heater 14 may be expanded to any length accordingly. Alternatively, there may be separate heater zones within the substrate heater 14 that directly correspond to the compartments and resulting deposition zones for further temperature control if needed.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention. It should be understood that all such modifications and improvements have been deleted herein for the sake of conciseness and readability but are properly within the scope of the following claims.

The invention claimed is:

1. A method for manufacturing a high temperature superconducting conductor, comprising:
   translating an elongate substrate through a reactor;
   forming a reaction product by reacting metalorganic precursor materials within the reactor;
   forming a high temperature superconducting layer on the substrate translating through the reactor, by depositing the reaction product onto the substrate;
   monitoring oxygen partial pressure in the reactor to monitor formation of the reaction product and to monitor supply of the metalorganic precursor materials into the reactor during forming; and
   controlling the supply of metalorganic precursor materials based on monitoring oxygen partial pressure.

2. The method of claim 1, further comprising controlling stability of the supply of the metalorganic precursor materials into the reactor.

3. The method of claim 1, wherein the precursor materials comprise vaporized species.

4. The method of claim 1, wherein supply of the precursor materials is controlled for at least about 20 hours.

5. The method of claim 3, wherein the step of forming is carried out by metalorganic chemical vapor deposition (MOCVD), in which the precursors react to form the reaction product.

6. The method of claim 1, wherein the high temperature superconductor layer has a Jc greater than about 1 $MA/cm^2$.

7. The method of claim 6, wherein the high temperature superconductor layer has a Jc greater than about 2 $MA/cm^2$.

8. The method of claim 1, wherein the high temperature superconductor layer has a current capacity of at least 150 A/cm width.

9. The method of claim 1, wherein the elongate substrate has a bi-axial texture, on which the high temperature superconducting layer is formed.

10. The method of claim 9, wherein the elongate substrate includes a buffer layer, the buffer layer having said bi-axial texture.

11. The method of claim 9, wherein the bi-axial texture comprises a cubic texture.

* * * * *